(12) United States Patent
Adhikari et al.

(10) Patent No.: US 11,777,186 B2
(45) Date of Patent: Oct. 3, 2023

(54) FRONT-END MODULE COMPRISING FRONT-END COMPONENTS AND A SUBSTRATE INTEGRATED WAVEGUIDE FILTER FORMED ON A PRINTED CIRCUIT BOARD

(71) Applicant: ALLEN-VANGUARD CORPORATION, Ottawa (CA)

(72) Inventors: Sulav Adhikari, Nepean (CA); Ernst Wallisch, Jr., Gloucester (CA)

(73) Assignee: ALLEN-VANGUARD CORPORATION, Ottawa (CA)

( * ) Notice: Subject to any disclaimer, the term of this patent is extended or adjusted under 35 U.S.C. 154(b) by 499 days.

(21) Appl. No.: 16/647,319

(22) PCT Filed: Sep. 14, 2018

(86) PCT No.: PCT/CA2018/051139
§ 371 (c)(1),
(2) Date: Mar. 13, 2020

(87) PCT Pub. No.: WO2019/051601
PCT Pub. Date: Mar. 21, 2019

(65) Prior Publication Data
US 2021/0127489 A1 Apr. 29, 2021

Related U.S. Application Data

(60) Provisional application No. 62/559,471, filed on Sep. 15, 2017.

(51) Int. Cl.
*H01P 1/213* (2006.01)
*H01P 1/207* (2006.01)
(Continued)

(52) U.S. Cl.
CPC ............ *H01P 1/2138* (2013.01); *H01P 1/207* (2013.01); *H01P 1/2088* (2013.01); *H01P 3/121* (2013.01);
(Continued)

(58) Field of Classification Search
CPC ...... H01P 3/121; H01P 1/2138; H01P 11/002; H01P 11/003; H01P 1/2088; H01P 11/007
(Continued)

(56) References Cited

U.S. PATENT DOCUMENTS 7,550,826 B2 6/2009 Orth et al.
7,670,151 B2 3/2010 Yang
(Continued)

FOREIGN PATENT DOCUMENTS

CN 104934662 9/2015
KR 20050046490 3/2011

OTHER PUBLICATIONS

Sulav Adhikari et al: "Universite De Montreal Electric and Magnetic One-and Two-Dimensionally Tuned Parameter-Agile Substrate Integrated Waveguide Components and Devices", , Apr. 30, 2014 (Apr. 30, 2014), XP055734940, Retrieved from the Internet: URL:https://publications.polymtl.ca/137 4/1 /2014_SulavAdhikari.pdf [retrieved on Sep. 29, 2020].
(Continued)

*Primary Examiner* — Benny T Lee
(74) *Attorney, Agent, or Firm* — Jenna L. Wilson; Wilson Lue LLP

(57) ABSTRACT

System, apparatuses and methods are disclosed which relate to the use of substrate integrated waveguide technology in front-end modules. An example circuit card assembly for use as a cellular base station front-end is disclosed which includes at least one component printed circuit board (PCB) layer having front-end module hardware components and at
(Continued)

least one filter PCB layer including at least one substrate integrated waveguide (SIW) filter.

14 Claims, 13 Drawing Sheets

(51) Int. Cl.
   *H01P 3/12*     (2006.01)
   *H04W 88/08*    (2009.01)
   *H05K 1/11*     (2006.01)
   *H05K 1/18*     (2006.01)
   *H05K 3/34*     (2006.01)
   *H01P 1/208*    (2006.01)
   *H01P 11/00*    (2006.01)

(52) U.S. Cl.
   CPC ........... *H01P 11/007* (2013.01); *H04W 88/08* (2013.01); *H05K 1/115* (2013.01); *H05K 1/18* (2013.01); *H05K 3/3494* (2013.01); *H05K 2201/015* (2013.01); *H05K 2201/037* (2013.01); *H05K 2201/09609* (2013.01); *H05K 2201/09985* (2020.08)

(58) Field of Classification Search
   USPC .................................................. 333/248, 134
   See application file for complete search history.

(56) References Cited

U.S. PATENT DOCUMENTS

| | | | |
|---|---|---|---|
| 7,978,475 | B2 | 7/2011 | Urai |
| 8,439,241 | B2 | 5/2013 | Stangl et al. |
| 2011/0161029 | A1 | 6/2011 | Wang et al. |
| 2014/0240186 | A1 | 8/2014 | Zhou et al. |
| 2015/0048471 | A1* | 2/2015 | Hasch et al. ........ H01L 21/4803 257/664 |
| 2016/0204514 | A1 | 7/2016 | Miraflab et al. |
| 2017/0084971 | A1 | 3/2017 | Kildal et al. |
| 2018/0026378 | A1 | 1/2018 | Kildal et al. |

OTHER PUBLICATIONS

Nafe Ahmed et al: "A Ferrite LTCC-Based Monolithic SIW Phased Antenna Array", IEEE Transactions on Antennas and Propagation, IEEE Service Center, Piscataway, NJ, US, vol. 65, No. 1, Jan. 1, 2017 (Jan. 1, 2017), pp. 196-205, XP011638421, ISSN: 0018-926X, DOI: 10.1109/TAP.2016.2630502 [retrieved on Jan. 2, 2017].

* cited by examiner

PCB Bottom View

SMT Process & Stiffener Fixture $Z0 = (138 / \sqrt{\varepsilon}) \times \log(D/d)$

FRONT-END MODULE COMPRISING FRONT-END COMPONENTS AND A SUBSTRATE INTEGRATED WAVEGUIDE FILTER FORMED ON A PRINTED CIRCUIT BOARD

TECHNICAL FIELD

This specification relates to implementations of a front-end module, such as a radio frequency (RF) front-end module for long-term evolution-standard (LTE) base stations.

BACKGROUND

Cellular base stations are in widespread use globally. The demand for cellular services is expected to continue to grow. Small cell base stations are an aspect of network densification and, in some cases, are expected to be deployed in ways, such as man-portable base stations, unmanned aerial vehicles (UAV), and weather balloons. Small cell manufacturers may need to consider size, weight and cost factors to meet the needs of systems such as these that include small cell base stations.

SUMMARY OF THE INVENTION

An example circuit card assembly for a cellular base station front-end includes at least one component printed circuit board (PCB) layer having front-end module hardware components; and at least one filter PCB layer including at least one substrate integrated waveguide (SIW) filter. The example circuit card assembly includes one or more of the following features, either alone or in combination.

The component PCB layer may have a different thickness from the filter PCB layer, for example the filter PCB layer may have a thickness at least five times greater than a thickness of the component PCB layer, or alternatively between two and five times the thickness.

The at least one substrate integrated waveguide may include a top metallized surface, a bottom metallized surface, and a plurality of discrete via holes therebetween. The discrete via holes may be arranged so as to form two rows of metallic walls.

Front-end module hardware components may include a digital interface, a radio frequency (RF) transceiver, an RF power amplifier, and digital control circuitry including an optional microcontroller.

The circuit card assembly may include a plurality of intermediate PCB layers between the component PCB layer and a duplexer PCB layer.

The frequency of operation of the SIW may be tunable to support multiple frequency bands.

The circuit card assembly may include at least one ferrite slab on an SIW transmission line. The at least one ferrite slab may be configured—for example, shaped, arranged, or both—to interfere with the electromagnetic field patterns of the SIW thereby rendering the SIW tunable.

The circuit card assembly may include at least one electromagnet deployed on a chassis holding the circuit card assembly. The circuit card assembly may include a means for biasing the magnetic field emitted by the at least one electromagnet to provide an orthogonal magnetic field to the ferrite slabs thereby varying the magnetic field applied to the SIW by the ferrite slab.

The circuit card assembly may include a digital analog converter (DAC) connected to the at least one electromagnet and in communication with a digital control circuit on the at least one component PCB layer. The digital control circuit may be configured—for example, constructed, arranged, or both—to control an output DC voltage of the DAC to vary the voltage applied to the electromagnet.

The circuit card assembly may include a digital analog converter (DAC) connected to a varactor diode and in communication with a microcontroller on the at least one component PCB layer. The microcontroller may be configured to control an output DC voltage of the DAC to vary a capacitance of the varactor diode, thereby tuning the SIW.

The circuit card assembly may include a first plurality of vias extending from the at least one component PCB layer to an internal surface of the at least one duplexer PCB layer. The circuit card assembly may include a first plurality of vias extending from the at least one component PCB layer to a top surface of the at least one duplexer PCB layer.

The circuit card may include a plurality of second vias extending through the duplexer PCB layer at a position laterally offset from the first vias.

The at least one component PCB layer and the duplexer PCB layer may each comprise a break-off section extending beyond respective outer perimeters of the at least one component PCB and the at least one duplexer PCB.

The circuit card assembly may include a scored portion at an intersection of the break-off sections of the respective at least one component PCB layer and the duplexer PCB layer. The scored portion may facilitate separation of the break-off sections from a respective at least one component PCB layer and the duplexer PCB layer.

The circuit card assembly may include at least one countersunk hole on each the break-off section.

A cellular base station comprising an antenna and a base station front-end may be implemented on the circuit card assembly as described in the preceding paragraphs.

In an example, the base station is an LTE evolved node B (i.e. eNB) base station. The base station may be a 2G, 3G, 4G, 5G, etc. base station.

The LTE evolved node B base station, or other appropriate type of base station, may be a portable small cell base station.

An example method for manufacturing a circuit card assembly includes manufacturing a PCB including a plurality of PCB layers having a main section and an enlarged section, populating at least one layer of the plurality of PCB layers with components, and breaking off the enlarged section. The example method may include one or more of the following features, either alone or in combination.

The method may include scoring the PCB at an intersection of the main section and the enlarged section at any point prior to the populating.

The method may include fixing the PCB to a stiffener.

The populating may include placing solder paste on the PCB and mounting the components by a pick-and-place machine.

The method may include passing the soldered board through a reflow soldering oven.

The breaking-off may include breaking off using a scoring wheel.

The method may include, prior to the fixing, drilling countersunk holes in the PCB. The fixing may include fixing the PCB to the stiffener via the countersunk holes such that a top surface of the PCB is flat resulting in no interference with the subsequent assembly processes.

The plurality of PCB layers may include at least one component layer and a filter layer.

The filter layer may be a substrate integrated waveguide (SIW) layer.

The component layer may have a different thickness from the SIW layer.

The SIW layer may have a thickness at least five times greater than a thickness of the component PCB layer, or alternatively between two and five times the thickness.

The method may include providing a first set of via holes in the at least one component layer and a second set of via holes in the filter layer.

The first set of via holes may be laterally offset from the second set of via holes.

An example apparatus for reducing warpage in a circuit card assembly includes a break-off portion extending outwardly from a main portion of each PCB layer in the circuit card assembly, and a stiffener configured—for example, sized, dimensioned, or both—to support the circuit card assembly beneath the break-off portion. The stiffener has a hollow interior such that the main portion is not obstructed by the stiffener. The example apparatus includes a connector for rigidly fixing the break-off portion to the stiffener. The example apparatus may include one or more of the following features, either alone or in combination.

The break-off portion may include a plurality of countersunk holes. The connector may include a plurality of screws sitting within the countersunk holes such that a top surface of the break-off portion remains generally flat.

The stiffener may be reusable or discardable after each use.

Any two or more of the features described in this specification, including in this summary section, may be combined to form implementations not specifically described in this specification.

All or part of the apparatus, methods, systems, and techniques described herein may be implemented using, controlled by, or both implemented using and controlled by a computer program product that includes instructions that are stored on one or more non-transitory machine-readable storage media, and that are executable on one or more processing devices. Examples of non-transitory machine-readable storage media include, e.g., read-only memory, an optical disk drive, memory disk drive, random access memory, and the like. All or part of the apparatus, methods, systems, and techniques described herein may be implemented as an apparatus, method, or system that includes one or more processing devices and memory storing instructions that are executable by the one or more processing devices to perform the stated operations.

The details of one or more implementations are set forth in the accompanying drawings and the description below. Other features and advantages will be apparent from the description and drawings, and from the claims.

BRIEF DESCRIPTION OF THE DRAWINGS

The example front-end module is illustrated in the figures of the accompanying drawings which are meant to be exemplary and not limiting, in which like references are intended to refer to like or corresponding parts, and in which:

FIG. 11B is a cross section taken at the section line 11B-11B in FIG. 11A.

DETAILED DESCRIPTION OF THE INVENTION

Figure 1:
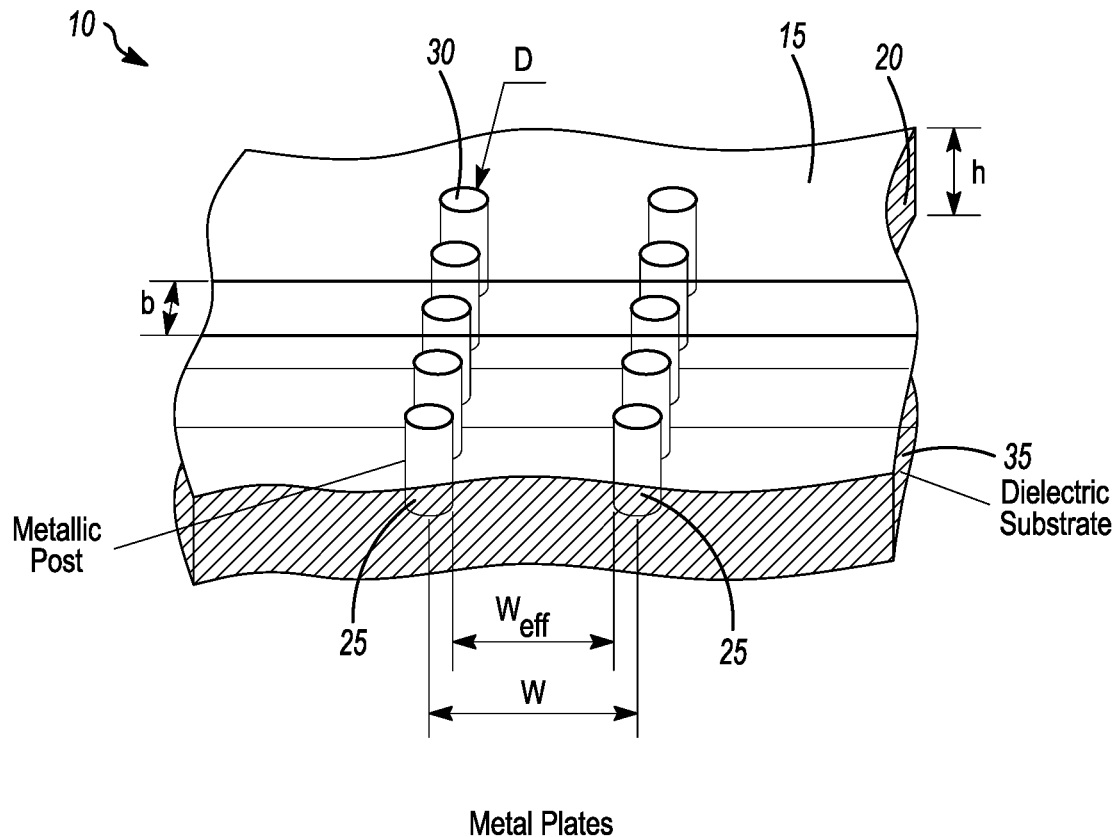
FIG. 1 shows an example substrate integrated waveguide (SIW) forming a duplexer layer of an example front-end module.

In mixed-use telecommunications antennae, it may be advantageous for a single terminal to be able to support communications using different networks characterized by standards such as GSM (global system for mobile communication) or 2G, UMTS (universal mobile telecommunications system) or 3G, LTE (long term evolution) or 4G and emerging 5G. Such a terminal may include a front-end module connected to an antenna terminal. A front-end module may include a transceiver, a switching element connected to an antenna, a duplexer or filter element separating two desired bands of a wireless frequency signal transmitted and received by the antenna, an amplifier element amplifying the transmitted wireless frequency signal, and receiver gain stages.

In an example, an RF front-end module of an LTE Evolved Node B (i.e. eNB) includes high power transmit (also known as downlink or DL) and receive (also known as uplink or UL) chains, with designated LTE frequency bands and each band of frequencies is assigned to operate either in frequency division duplexing (FDD) or time division duplexing (TDD) modes. For FDD mode, appropriate isolation between the DL and UL chains can improve communications. For example, transmission leakages into the receive band may increase the input noise level and distort the received signal. In order to maintain an appropriate level of isolation between the DL and UL chains, one or more duplexers are used.

With the increasing demand for portable eNBs for small cell networks (for example, in public safety applications), it may be desirable to have eNBs that can easily be transported from one place to another to cover emergency areas where small-cell coverage is needed. A portable eNB could be mounted on emergency vehicles, or could even be carried as a back-pack unit. Therefore, it can be beneficial, in some cases, for portable eNBs to be relatively light in weight and small in size.

In some cases, the weight and the form factor of eNBs may be dictated by the size and weight of the duplexer(s) used in the eNBs. Reducing the size and weight of the duplexers may correspondingly reduce the size and the weight of eNBs. In some cases, it may also be beneficial to use a single eNB to cover more than one LTE frequency band. In some implementations, the front-end module described herein (also referred to as "the example front-end module") has a reduced weight, a reduced form factor, or both, which may be useful for portable applications, among other things. In some implementations, the example front-end module also covers more than one LTE frequency band.

In some implementations, a cellular base station front-end design integrates various front-end technologies with one or more substrate integrated waveguide (SIW) filters on a single circuit card assembly (CCA). In some implementations, the end product is a fully-integrated, lightweight, and frequency agile eNB for LTE cellular networks. However the features described herein are applicable to front-end modules that do not include these features, and that are not described in this specification.

SIW filter assemblies have electromagnetic fields propagating through a substrate material guided between two rows of metallic via walls. The electric loss of the propagating signal depends primarily on the substrate material and its thickness along a transverse direction of the CCA. The SIW filter itself may be configured for operation as a duplexer as described herein. Accordingly, in the duplexer is referred to as an SIW duplexer.

In some implementations, techniques for manufacturing the example front-end module may control warpage of the CCA, may simplify the manufacturing process, and may save manufacturing time. In some implementation, the integration of SIW filter technology and other components into the example front-end module may produce a via transition to move RF signals between PCB layers.

In the example front-end module, heavy cavity filters are replaced with SIW filters aimed at small cell applications. In some implementation, SIW filters are capable of similar performance to a cavity duplexer without the detrimental size, weight and cost penalties, and can be integrated with other front-end components onto a single CCA.

In some implementations, SIW filters may be manufactured on a PCB that includes two rows of metallic walls created by discrete via holes, making them relatively compact and lightweight. Exemplary metallic cavity duplexers are made from aluminum or Copper. SIW duplexers are typically made from standard PCB materials. When compared in terms of weight, exemplary SIW duplexers are in the range of 20-50 grams while metallic cavity duplexer weight can range from few hundred grams to kilograms. In some cases, the thickness of the PCB material used to implement SIW filters is thicker than those used for other components of the front-end module, such as a power amplifier (PA), gain amplifiers and a transceiver. When the various dissimilar layers of the PCB are combined during the PCB fabrication process, the resultant PCB may be prone to bending and warping. Furthermore, during population of the PCB with components to create the CCA, the CCA may be prone to bending and warping, thereby producing an unusable assembly. Also described herein are mechanisms using during both the PCB and CCA manufacturing process that may eliminate or reduce such bending and warping.

In some implementations, the thickness of the SIW PCB is not much greater than the thickness of the component PCB where the rest of the front-end is integrated. A thicker substrate may be preferred in manufacturing the SIW filter, for example, to reduce a total electric loss. In some cases, a low-loss performance can be achieved by selecting other materials that are as thin as the front-end PCB. In some cases, the sequential lamination of the PCB results in the assembly being asymmetrical rather than having different PCB thickness.

In some implementations, the example front-end module is part of a fully-integrated, lightweight and frequency agile eNB for LTE networks (or any other appropriate network types including, but not limited to, 2G, 3G, 4G, and 5G networks). Example implementations of an eNB may include one or more of the following technologies: substrate integrated waveguide (SIW) technology to implement a lightweight, low cost, and high power cavity duplexers and filter cavity duplexers and filters integrated on the same RF front-end power amplifier (PA) PCB; tunable ferrite slabs and varactor diodes included on the SIW filters and duplexers to render the duplexers frequency-tunable to cover multiple frequency bands; and an integrated tuning mechanism on the eNB to achieve desired frequency tunings.

SIWs are used in the example front-end module in place of, for example, a hollow metallic waveguide. The SIWs themselves are configured to perform duplexing functions. FIG. 1 shows an example SIW 10 for use in the example front-end module indicated as Metal Plates. SIWs having other configurations may be used as well. Example 51 W 10 includes a top metallized surface 15 and a bottom metallized surface 20. In this example, discrete via holes 25 are arranged to form two rows of metallic walls 30. The via holes may be plated or filled, for example with a metallic post. Exemplary dimensions, D (diameter of Metallic Post), h (substrate height), b (centerline spacing), W (spacing between Metallic Post centers, War (minimum spacing between Metallic Posts) are shown are. In use—for example, in the system of FIG. 2—an electromagnetic wave is guided through the dielectric substrate material 35 between the two rows of via holes 25, which provide shielding. Exemplary via holes may be arranged in an area of a maximum of 6"×6" spaced at approximately 10 mils. This results in about 5000-10000 metallic posts. Via holes could be arranged in two or more rows or any other convenient orientation. The posts may be arranged in parallel, orthogonal or angular orientations. Electromagnetic fields are guided within the substrate between the rows are via holes. Unlike conventional transmission line technologies like microstrip and coplanar waveguide, the electromagnetic fields are not in the air. Thereby improving the isolation with the rest of the circuitry. Thus, the nature of the SIW technology offers a better electromagnetic shielding against the external interferences. The SIW is a one conductor transmission line, the upper and bottom conductor act like a parallel plate waveguide for the propagation of the electromagnetic wave. The via shielding will determine the cut-off frequency of the transmission. The wider the via shielding spacing, the lower will be the cut-off frequency and vice-versa.

Figure 2:
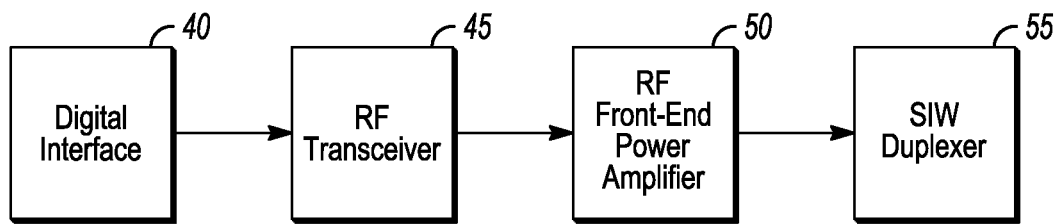
FIG. 2 is an example of a circuit card assembly used in the example front-end module.

FIG. 2 shows a schematic representation of an example integrated system that includes the example front-end module of FIG. 1. The system shown in FIG. 2 includes a digital interface 40 interfacing with an antenna, an RF front end transceiver 45, an RF power amplifier 50, and at least one SIW duplexer 55, an example of which is described with respect to FIG. 1 above. The digital interface may be standard digital interfaces. The RF transceiver may be a dual channel transceiver, operating from 500 MHz to 6 GHz, generates output up to +14 dBm, accepts digital data with the combination of DAC and mixers converts the digital signals into analog domain and vice versa. The power amplifier converts low power analog signal to high power analog analog signal. In addition to having higher gain to produce higher output, is also highly power efficient to reduce the thermal dissipation of the electrical power. The power amplifier is operated with a linearizer circuit to obtain high power, highly efficient and highly linear analog output signal. The RF transceiver converts the digital stream of data to low power analog domain, and the power amplifier converts the low power signal to high power output which is highly efficient and linear to be transmitted via antenna. Higher the output power of the power amplifier, higher is the coverage of the eNB station.

In some implementations, an SIW-implemented duplexer or duplexers is/are integrated on the same circuit card assembly (CCA) board with the entire RF front-end module—including, for example, power amplifiers and digital control circuitry, such as a microcontroller. A single CCA board that includes a duplexer may, in some cases, reduce the overall weight, size and cost of the eNB. Such a configuration may be useful for mobile and small-area applications in which a mobile eNB is used.

Figure 3:
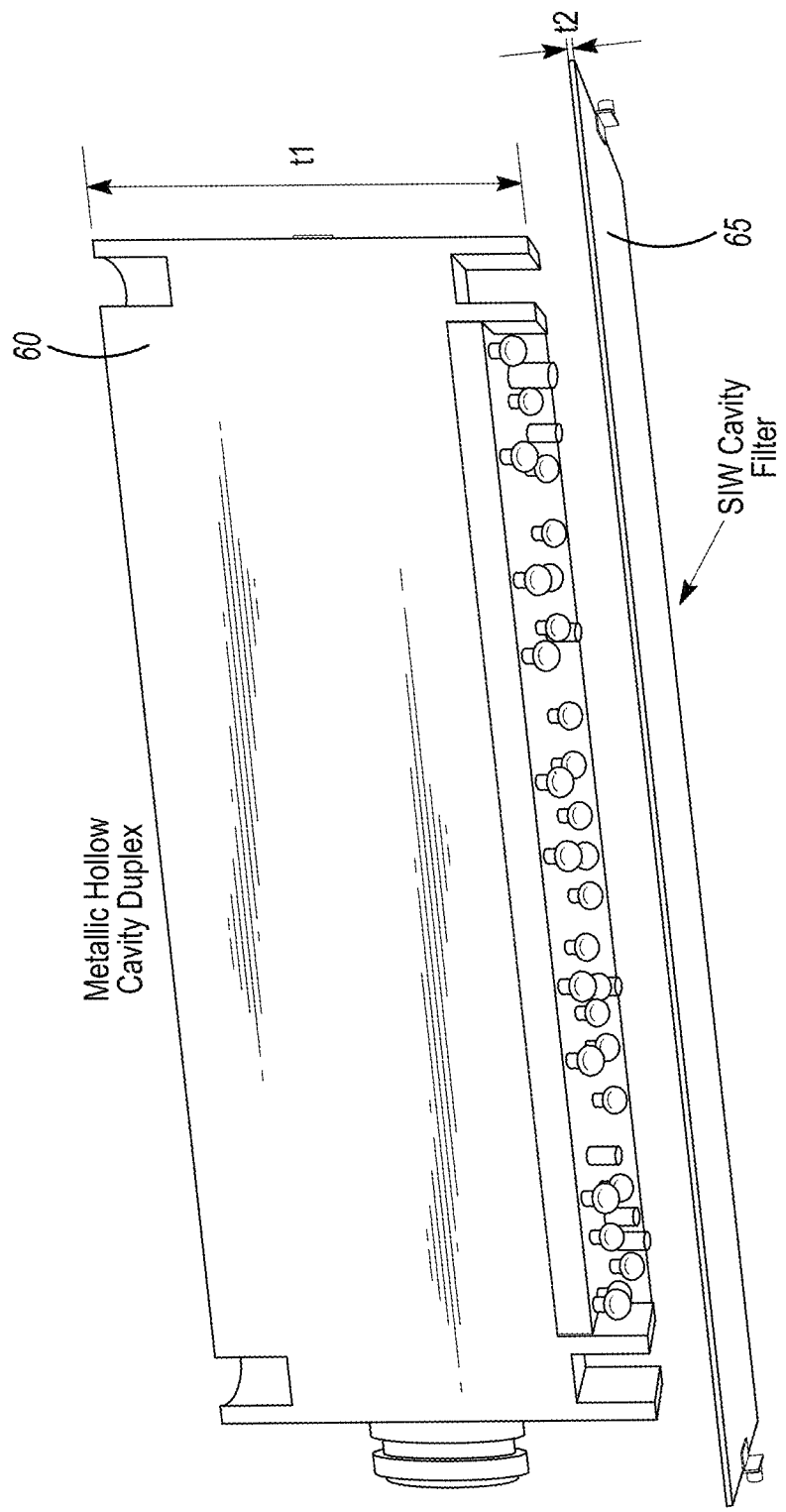
FIG. 3 shows a graphical comparison of an example prior art duplexer and an example SIW-implemented duplexer.

Referring to FIG. 3, an example prior art cavity duplexer (A Metallic Hollow Cavity Duplex) 60 is shown for comparison purposes alongside an SIW-implemented duplexer 65 used in example front-end module. FIG. 3 is shown to scale to illustrate the difference in size between prior art duplexer 60 and SIW-implemented duplexer 65 (SIW Cavity Filter).

In some implementations, separate CCA boards may be used where restrictions are imposed on the physical structure of the front-end module's packaging. Even if a separate CCA board is used for the SIW-implemented duplexer, it is still evident from FIG. 3 that the overall size of the resulting duplexer may be reduced relative to a particular type of prior art duplexer. For example, in some implementations, the SIW-implemented duplexer has a thickness $t_2$ that is approximately 100 times thinner and lighter than a thickness $t_1$ of a correspondingly-functioning metallic cavity duplexer.

Figure 4:
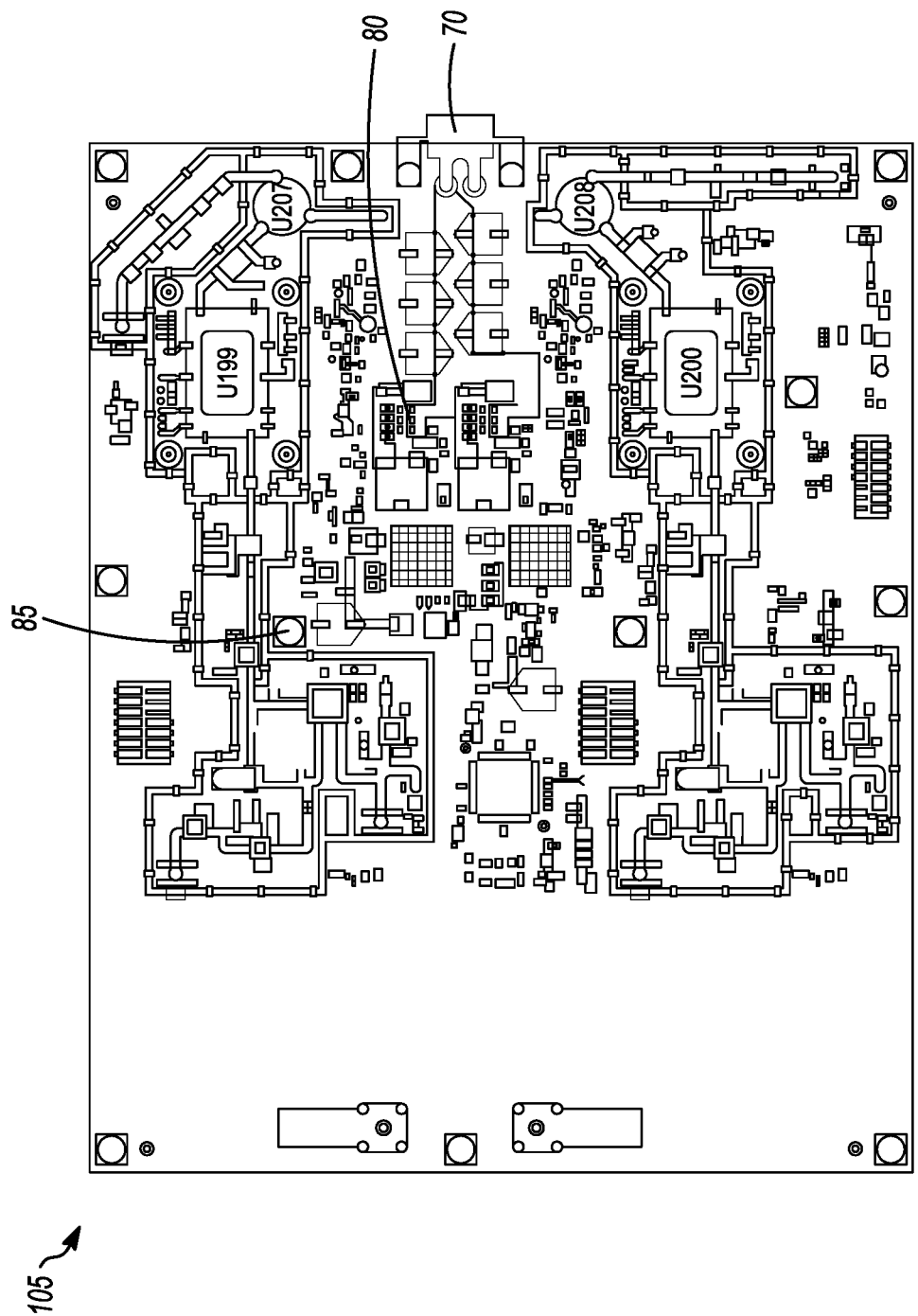
FIG. 4 is a top view of an example circuit card assembly for use in the example front-end module.
Figure 5:
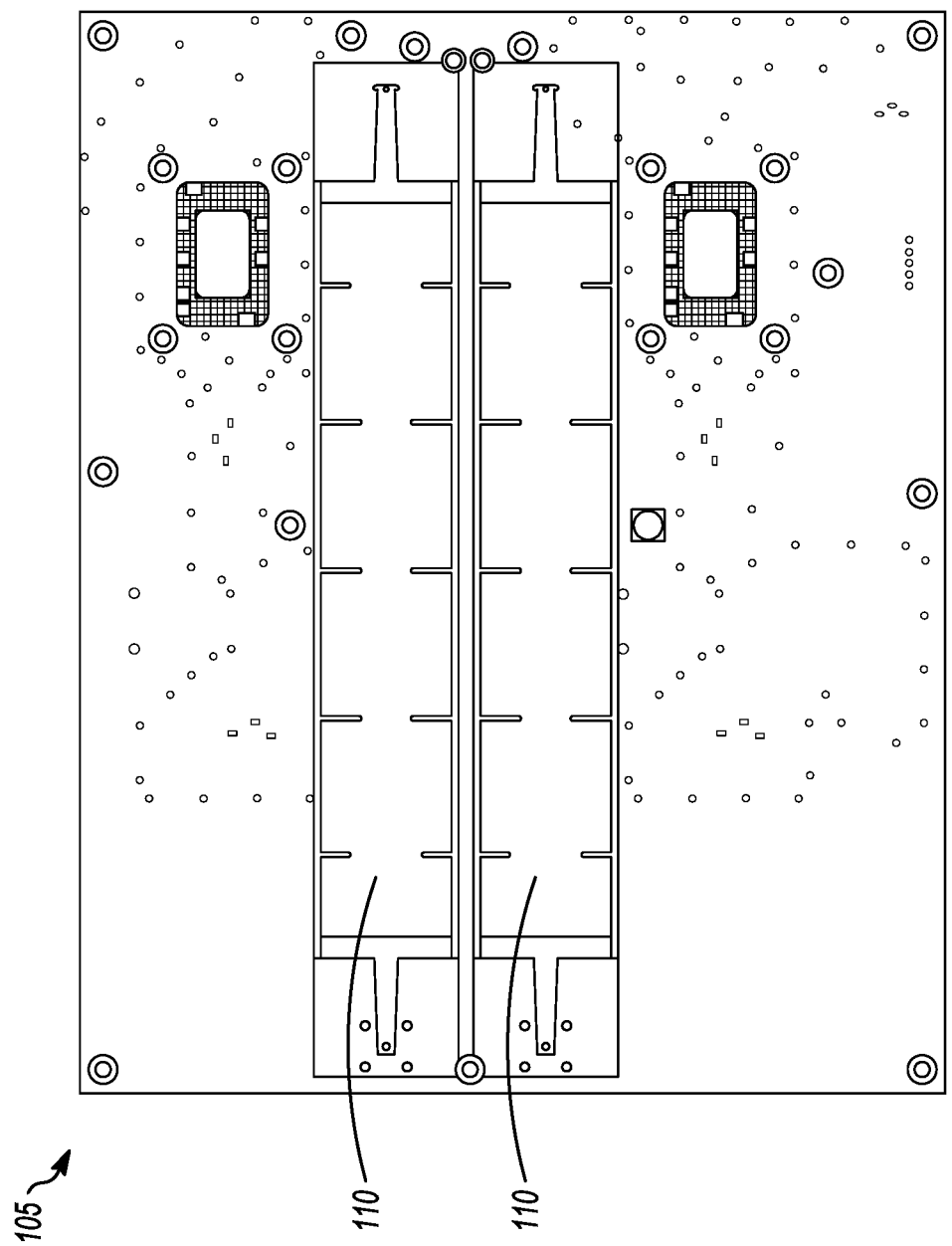
FIG. 5 is a bottom view of the example circuit card assembly of FIG. 4.

In some implementations, such as those shown in FIGS. 4 and 5, the front-end CCA board 105 includes the SIW 110 (FIG. 5) directly implemented on its own PCB layer. In these implementations, a distinct PCB layer is formed as the substrate of FIG. 1, and the SIW filter portions include metallic plates and via holes on a filter-side of the integrated CCA. On a top side of the CCA board, there may be provided typical front-end components, such as a digital interface 70 providing a signal connection to the front-end, an RF transceiver 80, and RF front-end amplifiers 85 as shown in FIG. 4. On a layer beneath the top side, the SIW duplexer layer includes via holes formed between the layers for signal and waveguide propagation.

The CCA board, in the implementation of FIGS. 4 and 5, is formed from two or more printed circuit board layers that are stacked in a PCB fabrication process. The overall thickness of the CCA board in this implementation is uniform across the surface area thereof, but as will be discussed below, the thickness of the PCB layer used for the SIW-implemented duplexer may be thicker than the PCB layer required for other components. Accordingly care may be taken in the manufacturing process to control warpage of the final CCA. Specific technical details of SIW technology and its implementation on PCB layers can be found in, for example, Wu, K., Deslandes, D., Cassivi, Y., "The substrate integrated circuits—a new concept for high-frequency electronics and optoelectronics," International Conference on Telecommunication in Modern Satellite, Cable and Broadcasting Service, pp. 2-9, 2003.

Figure 7:
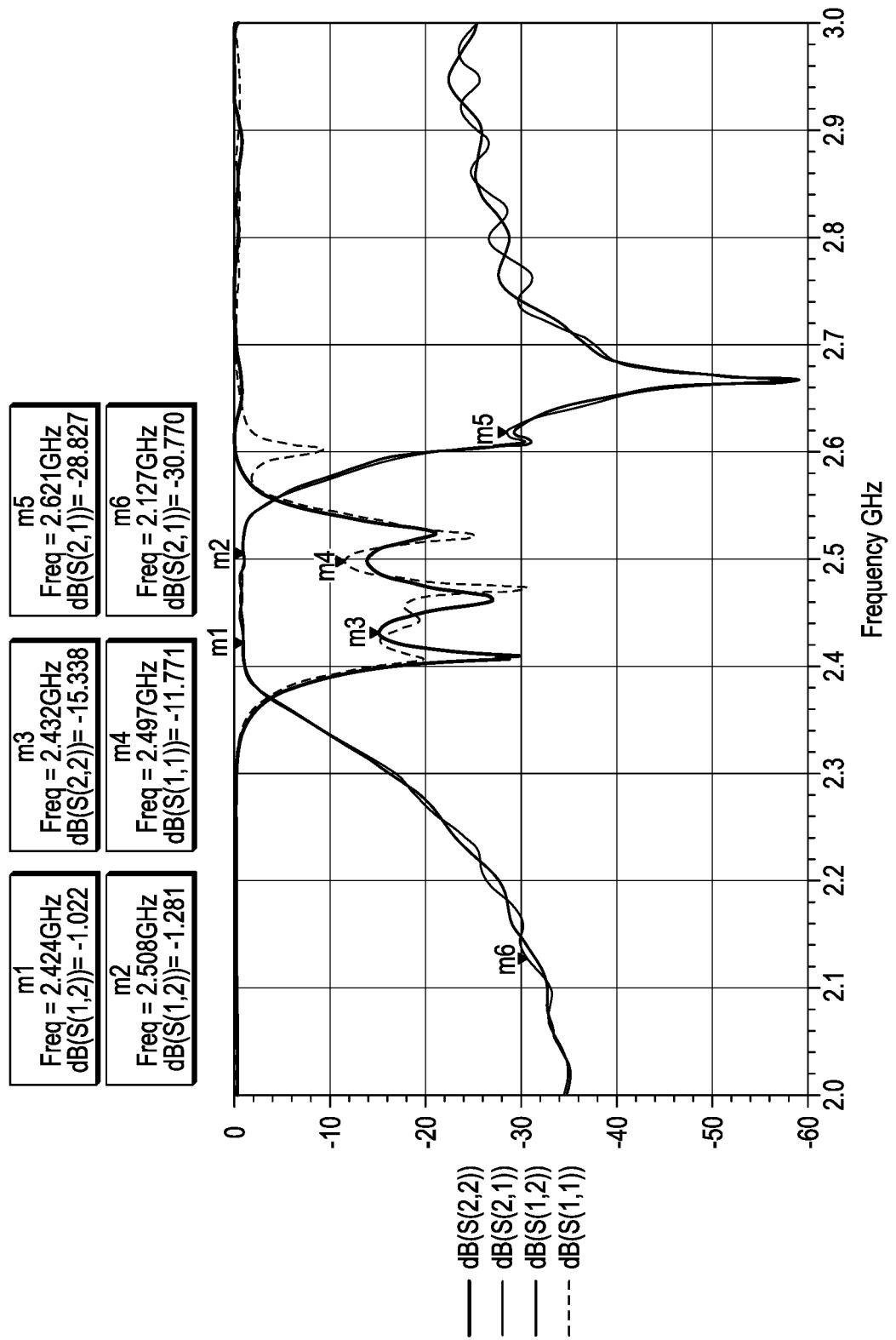
FIG. 7 shows test results produced by using an example SIW-implemented duplexer.

FIG. 7 shows test measurement results obtained using an example SIW filter. The filter used in this test was designed to operate for LTE E-UTRA band 7 (long term evolution evolved universal terrestrial radio access band 7). As shown, the pass band insertion loss is 1.2 dB and the return loss is better than 10 dB (on the vertical axis, where dB is shown). Frequency is shown on the horizontal axis in GHz. Each of the measurements m1, m2, m3, m4, m5 and m6 show the frequency and resultant dB measurement. Side band rejection is in the range of 40 dB, which can be improved upon by increasing the order of the filter. In this example, passband insertion loss and return loss are marginally worse than commercially available metallic cavity duplexers. This difference is still nevertheless sufficient to ensure compliance with industry standards and to ensure proper eNB operation. The example SIW filter provides reduced weight and size as a trade-off for reduced performance.

Figure 6:
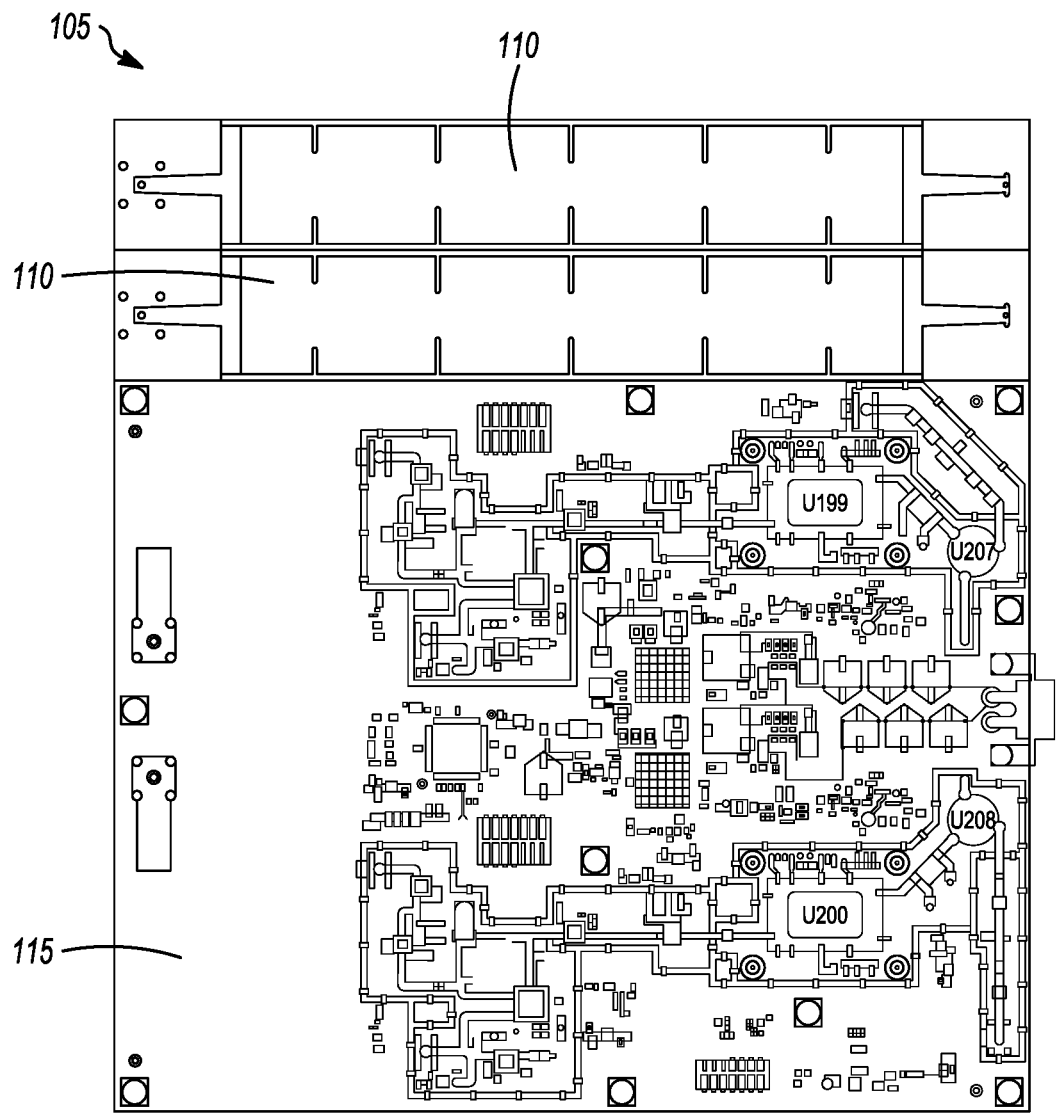
FIG. 6 is a top view of another implementation of the circuit card assembly for use in the example front-end module.

FIG. 6 shows an example eNB front-end module 115 on CCA board 105. SIW 110 is as previously described. On the top side shown in FIG. 4, the digital interface 70 operates as a signal connection to the front-end. The RF transceiver and RF front-end amplifiers are provided on one side of the CCA transceiver (referred to herein cumulatively as front-end components, when used to describe example hardware and signal communication components found on front-end modules, and referred to in the generic sense where the specific components are not of particular relevance to the described example front-end module). The other side of the CCA incorporates an SIW-implemented duplexer such as, but not limited to, that shown in FIG. 1.

The bottom of the board shown in FIG. 5 incorporates heat sinks for the power amplifiers 85 shown in FIG. 4. In both FIGS. 4 and 5, the SIW-implemented duplexer (or simply "the SIW duplexer") 100 is constructed on the metallic substrates described with respect to FIG. 1. In some implementations, the SIW duplexer 100 is produced separately from the rest of the front-end components and then joined to the rest of the circuit board as described below. In this implementation, the SIW duplexer is positioned at a side of the main component PCB portion for ease of construction, and the overall thickness of the CCA may be different on the main component side and on the SIW duplexer side.

In some implementations, an SIW duplexer or SIW duplexers used in the example front-end module is/are configured for tuning across frequency bands. In an example, an SIW duplexer includes magnetic and electric tuning elements to make its frequency tunable. SIW transmission lines support a transverse electric (TE) mode of operation. In this mode, electric field concentration is higher near the central region of the SIW transmission line and magnetic field concentration is higher along its sidewalls. The separation of electric and magnetic fields may be beneficial for implementing the frequency tunable elements in an SIW duplexer. For example, electric tuning elements like varactor-diodes can be placed along the central region of the SIW where the electric field concentration is highest, and magnetic tuning elements such as ferrite slabs can be placed along the side-walls where the magnetic field is highest. The two different tuning elements can be separately placed and controlled without interfering with each other. Thus, when applied with appropriate electric and magnetic bias, the tuning elements will directly interfere with the electromagnetic field patterns of the SIW and render the frequency tunable.

Figure 8:
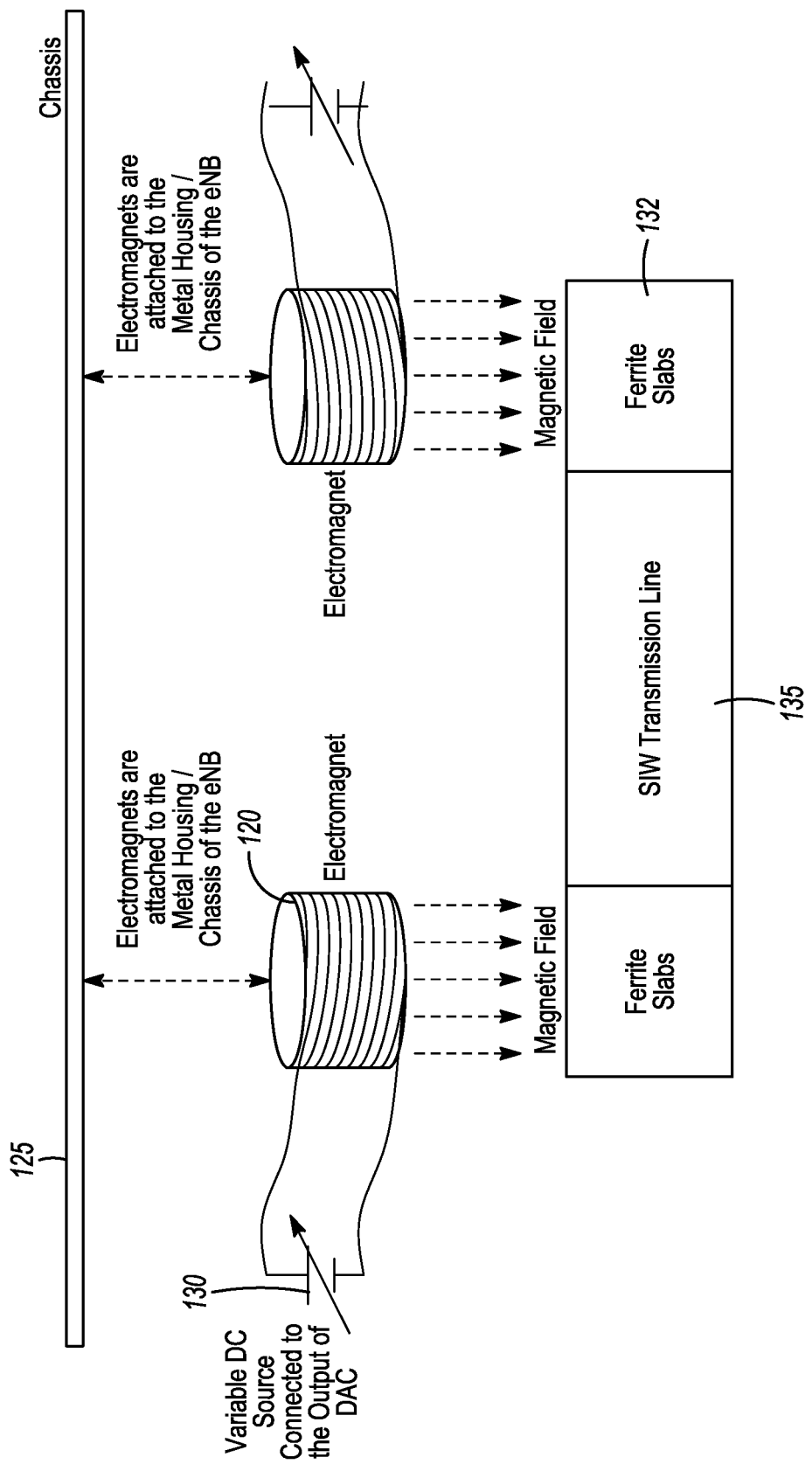
FIG. 8 is a schematic drawing of an example electromagnetic tuning device implemented on the circuit card assembly of the example front-end module.

FIG. 8 shows example magnetic and electric biasing mechanisms for use with the example front-end module. The example magnetic and electric biasing mechanisms configure the example front-end module for tuning in accordance with the principles described herein. The tuning mechanisms load SIW duplexers of the front-end module with ferrite materials and varactor diodes as magnetic and electric tuning elements, respectively. As shown in FIG. 8, for magnetic tuning, electromagnets 120 are deployed on the metal housing 125 or chassis of the eNB in this example. The electromagnets are attached to the Metal Housing or Chassis of the eNB. The magnetic field of the electromagnets is shown. A variable DC source 130 provides a bias to the electromagnets 120 to produce a desired magnetic field. The amount of magnetic field produced by the magnet can be varied by varying the applied DC bias. A microcontroller (not shown) on the front-end CCA board can be connected to a digital to analog converter (DAC) and so can be used as a variable DC voltage source, as shown proximate DC source 130. Thus, the magnetic field of an electromagnet can be directly controlled by the microcontroller on the CCA board, and is responsive to communicative instructions to adjust operating frequency bands.

In this example, the electromagnets 120 are positioned in close proximity to ferrite slabs 132 that are loaded on the SIW duplexers/Transmission Line 135. By varying the DC bias on the electromagnets 120, the orthogonal magnetic field applied to the ferrite slabs are also varied, making the SIW filter tunable.

Figure 9:
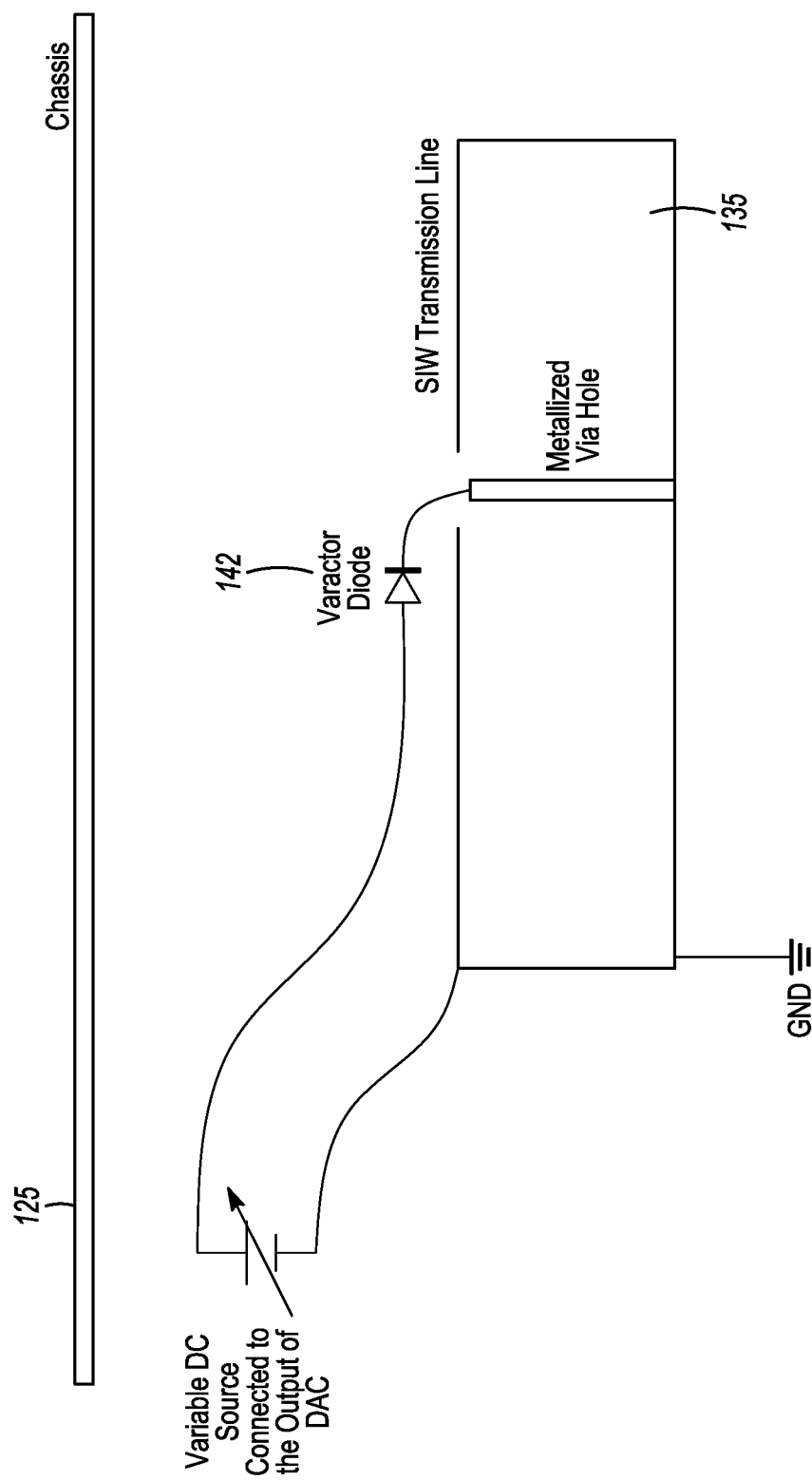
FIG. 9 is a schematic drawing of an example electrical tuning device implemented on the circuit card assembly of the example front-end module.

To implement electric field tuning, a biasing mechanism similar to that described above is employed, however no external electromagnet is required. Chassis 125 is as previously described. FIG. 9 shows an example electric tuning mechanism where the DC output of the DAC (as indicated by the Variable DC Source Connected to the Output of the DAC) is directly applied to a varactor diode 142 mounted on the SIW at the SIW Transmission Line 135 and via a Metallized Via Hole. A varactor diode 142 is a diode that has variable capacitance on its terminals. Grounding is indicated by GND Technical details and specifics of implementation of such electric tuning of SIW devices can be found with reference to He, F., Chen, X-P., Wu, K., and Hong, W, "Electrically tunable substrate integrated waveguide reflective cavity resonator," Asia Pacific Microwave Conference, pp. 119-122, 2009. Furthermore, the combination of magnetic and electric tuning can be implemented, for example as disclosed in S. Adhikari, A. Ghiotto, K. Wu, "Simultaneous Electric and Magnetic Two-Dimensionally Tuned Parameter-Agile SIW Devices", IEEE Transactions on Microwave Theory and Techniques, vol. 61, no. 1, pp. 423-435, January 2013. It should be noted that none of these references discuss an implementation on a front-end device, or specifics of the hardware implementation of magnetic tuning as herein disclosed.

One or both of tuning mechanisms described herein may, or may not, be incorporated into the SIW filter(s) of the example front-end module.

An example method for producing the example front-end module is also described (or alternatively, for producing other appropriate front-end modules or other appropriate CCA constructions). In some implementations, the example method may control warpage of the CCA to reduce the cost of assembly and reduce the amount of wasted components.

Example SIW filters described herein may be manufactured on a PCB comprised of two rows of metallic walls created by discrete via holes. However, the thickness of the PCB material used for the SIW filters may be thicker than those used for other components on the front-end, such as the power amplifier, gain amplifiers and transceiver (referred to herein cumulatively as front-end components, when used to describe hardware and signal communication components that may be found on front-end modules, and referred to in the generic sense where the specific components are not of particular relevance to the described example front-end module). When these various dissimilar layers for the PCB are combined during the PCB fabrication process, the resultant PCB may be prone to bending and warping. Furthermore, when the outer layer PCB layers are populated with components to create the CCA, the CCA itself may be prone to further bending and warping, producing a sometimes-unstable assembly.

As noted, SIW filter assemblies have electromagnetic fields propagating through a substrate material guided between two rows of metallic via walls. The electric loss of the propagating signal depends primarily on the substrate material and the thickness thereof along a transverse direction of the CCA. In some implementation, a high frequency ceramic-filled PTFE (polytetrafluoroethylene) composite circuit material is selected for the integrated design including the SIW in the small cellular base stated eNB front-end PCB design due to the composite circuit material having low loss properties and the ability of the composite circuit material to integrate with other laminates. An example of such material that may be used in the SIW filters described herein is produced by Rogers Corporation under the RO3003 trademark. In example high power eNB front-end design as described herein, in order to improve power efficiency, it is preferred to keep the electric losses after the power amplifier in the RF chain as low as possible. The aforementioned high frequency ceramic-filled PTFE composite can be provided in a thickness of 0.06" to reduce loss. However, in some implementations, the rest of the front-end circuitry before the power amplifier in the RF chain is designed on a 0.01" substrate. The thinner the substrate material is, the narrower the RF trace line widths are. In an example that uses a 10-mil substrate, the rest of the analog and digital circuits could readily be connected using narrow trace widths.

Figure 10:
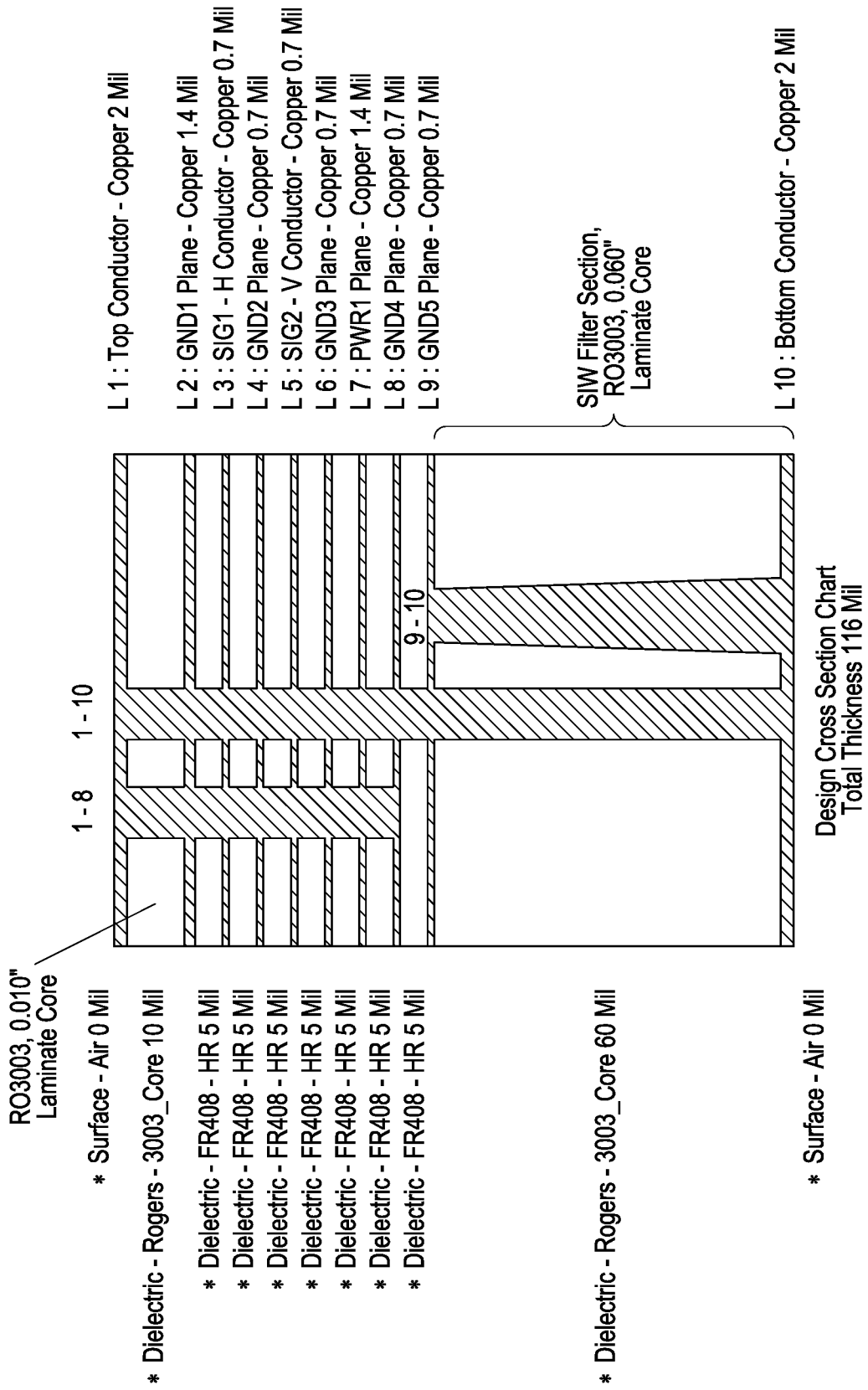
FIG. 10 is a cross-sectional view of the circuit card assembly of the example front-end module illustrating different PCB layer thicknesses.

FIG. 10 shows an example CCA having a total thickness of 0.0116" (as indicated a Design Cross Section Chart Total Thickness 116 Mil. The Surface is Air at 0 Mil.). The SIW filter layer includes a 0.6" laminate core (refer to SIW Filter Section RO3003 and the Laminate Core). In this example, the top surface L1 (Top Conductor—Copper), including the RF chain components, includes a 0.01" laminate core. A plurality of intermediate layers, including ground planes and conductor layers shown as L2-L9, have thicknesses of either 0.05" or 0.07" and a bottom conductor layer L10. Parameters of these layers are exemplified as indicated in FIG. 9. In some cases, the asymmetric stacking of the PCBs as shown in FIG. 10 may lead to a higher risk of material warpage. In some cases, warpage may be defined in the IPC-A-600 standard, which states that when a PCB exceeds a bow and twist of 0.75%, it fails the standard warpage test and must be scrapped. The Dielectric parameters indicated in FIG. 10 are exemplary parameters and measurements only, as would be readily understood by one skilled in the art.

The use of an asymmetric stack may be beneficial to the overall system because having the SIW layer exposed on either the top or bottom layer—as opposed to being sandwiched in the middle like layers L2-L8— provides a useful thermal boundary to manage heat dissipation requirements of the SIW layer and avoids connectivity challenges which may adversely affect signal integrity.

During the PCB manufacturing process, multiple layers of the PCB may be laminated together. These layers may be relatively symmetric so that the final PCB does not tend to bend or warp. Producing the PCB, including the SIW layers as herein described, may require asymmetric layering in some cases and, in such cases, greater attention may have to be paid to the bending and warping issue.

Initially, the environment in which PCBs are manufactured is carefully controlled. For example, the pressure, temperature range, temperature ramp up rates and dwell times may be controlled to manage the material reaction to the manufacturing process. In some implementations, innerlayers of the PCB are baked at approximately 110° C. to 125° C. (230° F. to 260° F.) for 30 to 120 minutes to ensure removal of volatile substances prior to bonding.. In some cases, reasonable warpage target for the PCB assembly as this stage is within 1% deviation from flat over the entire board, which meets the IPC allowable limit.

Populating the PCB with components used to form the RF chain, filters, etc. follows the PCB fabrication stage, and is referred to as the CCA manufacturing stage. An example technique for CCA manufacture employs a surface mounting technology (SMT) process by which surface mount devices are installed on the PCB. During this stage, solder paste is first placed on the PCB, components are mounted by a pick-and-place machine, and then those components are soldered to the PCB by passing the assembly through a reflow soldering oven. Even if the precautions discussed above in the control of the PCB manufacturing stages are followed, when the PCB passes through a reflow oven, the elevated temperatures may relax the material and the resultant assembly may warp more than the IPC allowable limits as it cools post reflow. This warpage, in some cases, is directly related to the asymmetrical assembly herein proposed.

While various top-clamping style fixtures and hold-down approaches do exist (albeit for different purposes than addressing the warpage due to asymmetry), many of these include elements that interfere with solder paste printer and pick-and-place equipment or that require the installation and removal of a fixture at multiple steps during the CCA process. This may negatively impact manufacturing time and risks disturbing the components, resulting in solder defects.

In addition to the control of the fabrication variables involved in the PCB process due to asymmetric layering, the example manufacturing method includes construction of the PCB using a break-off section on an outside edge of the PCB around the perimeter of the PCB. A purpose of this break-off section is to allow for the installation of a fixture during the CCA stage that can be removed at the end of the CCA stage. Accordingly, a support fixture may be used, which may be mounted to the PCB assembly prior to commencement of the CCA manufacturing process. A purpose of the fixture is to keep the PCB flat during all or part of the CCA process. In some implementations, the fixture itself should avoid any interference with the automated assembly processes, particularly the solder paste process and the pick-and-place process.

After the CCA cools back to ambient temperature after removal from the reflow oven, the fixture can readily be removed by snapping-off the break-off section of the PCB. After the CCA has cooled, no further warpage occurs for the CCA during normal operation and the assembled CCA is well within the warpage limit. The fixture described below may be discarded after each use or it may reused.

Figure 11A:
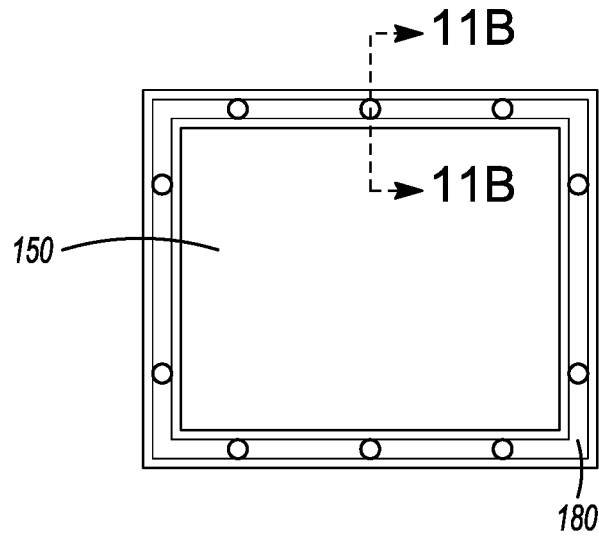
FIGS. 11A and 11B show an example apparatus for reducing warpage of an example circuit card assembly during its manufacture.
Figure 11B:
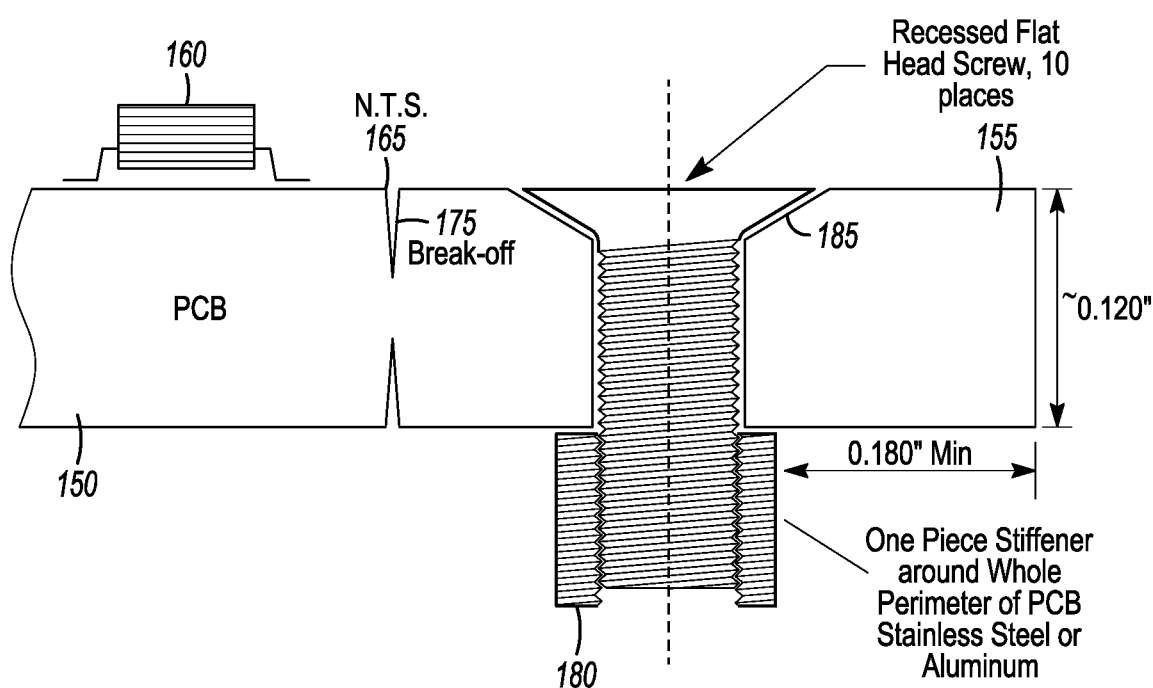
Figure 12:
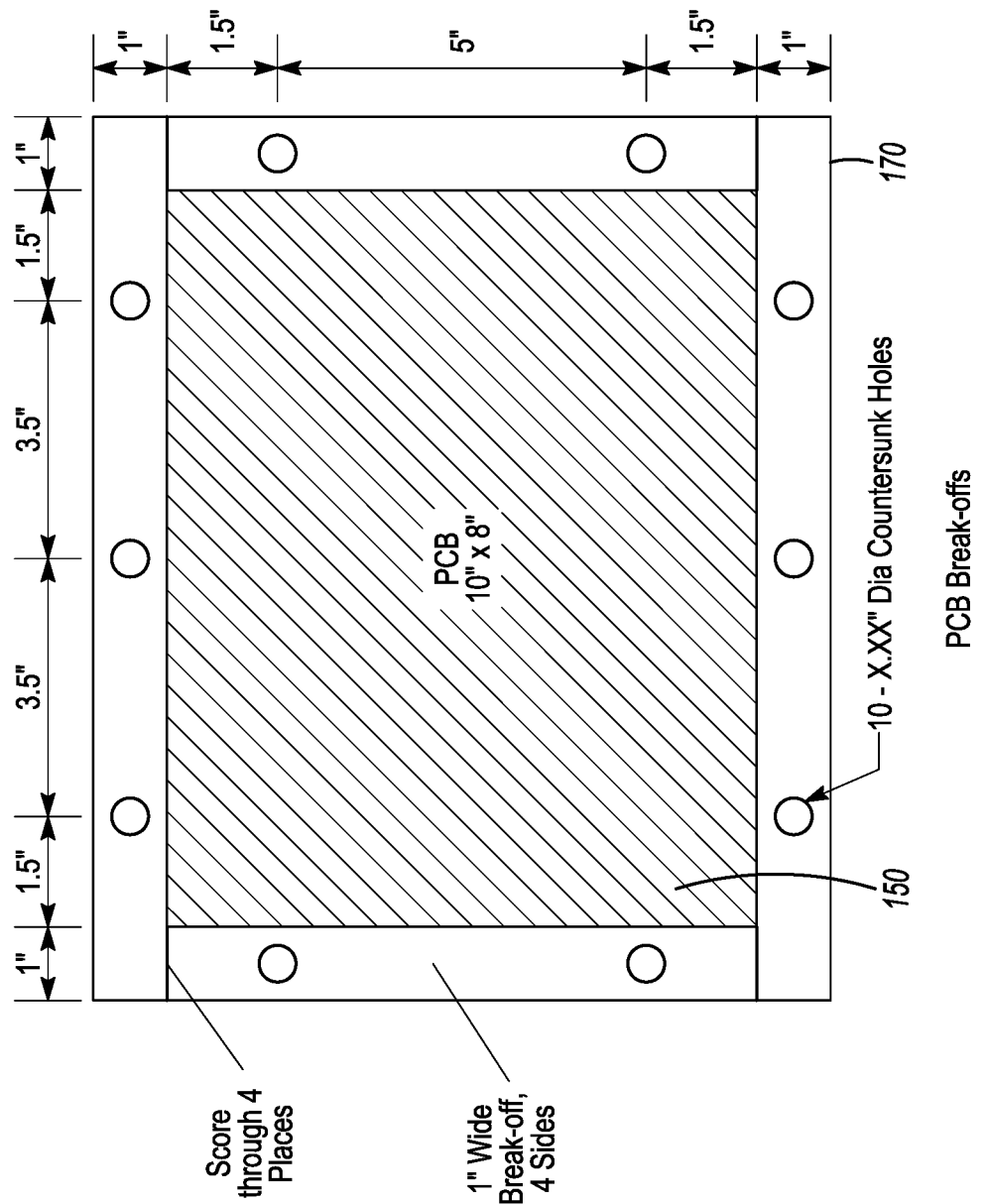
FIG. 12 shows a PCB having a break-off section.

FIGS. 11A and 11B (SMT Process & Stiffener Fixture) show an example PCB assembly 150 prior to the CCA process. FIG. 11A is a PCB Bottom View. Each of the PCBs within the assembly 150 is manufactured to include a break-off section 155 around the entire perimeter thereof, or optionally around one or more sides only. In the enlarged view, the PCB 150 is shown to have a surface mount component 160. An outer edge 165 of the PCB 150 includes an extension or break-off section, which includes regular PCB material without any components mounted thereto. The break-off section and the main PCB section 150 are joined at a scored portion 175 to facilitate break-off of the break-off section 170 (FIG. 12). Exemplary dimensions such as a 0.120" thickness and a 0.180" minimum distance, are also shown.

A stiffener 180 produced from, for example stainless steel or aluminum, (also shown as One Piece Stiffener around While Perimeter of PCT Stainless Steel or Aluminum) may be arranged around the perimeter of the PCB 150, and particularly around the break-off section 170. In some implementations, the stiffener 180 provides a support base for the PCB while components are surface mounted, and also stiffens the entire assembly through the oven heating process and subsequent cool-down. In this example, the PCB 150 is attached to the stiffener by way of a countersunk hole 185 included in the break-off section 170. A screw is fitted into the countersink and threaded into the stiffener to rigidly fix the PCB 150 to the stiffener 180. The stiffener 180 may be, or include, a one-piece stiffener. A Recessed Flat Head Screw, 10 places is also indicated.

After cool-down, the break-off section 170 (and by extension the stiffener 180) can be removed by snapping off, either manually or by use of a scoring wheel machine.

FIG. 12 shows an example PCB 150 having break-off section 170. In this example, a score to facilitate break-off is included along the entire intersection of the PCB 150 and the break-off sections 170. In this example, countersunk holes are provided at spacings of between 3.5"-5" to maintain the board stiffness. The break-off section 170 may be approximately 1" wide, for example. All dimensions shown, such as a 10"×8" PCB area and a 1.5" are exemplary. A Score through 4 Places and the 1" Width Break-off, 4 Sides are shown. 10 Countersunk Holes are also indicated.

The PCB with break-off section as described herein appear as a simple PCB for the purposes of CCA manufacture and surface mounting of components. In some implementations, there are no elements which protrude beyond the top surface of the PCB that can interfere with manufacturing automation, especially the solder paste printer, and the stiffener supports the CCA around the discardable break-off section only. In some implementations, the main PCB portion is untouched, and yet fully supported by the stiffener around its entire perimeter.

Figure 13:
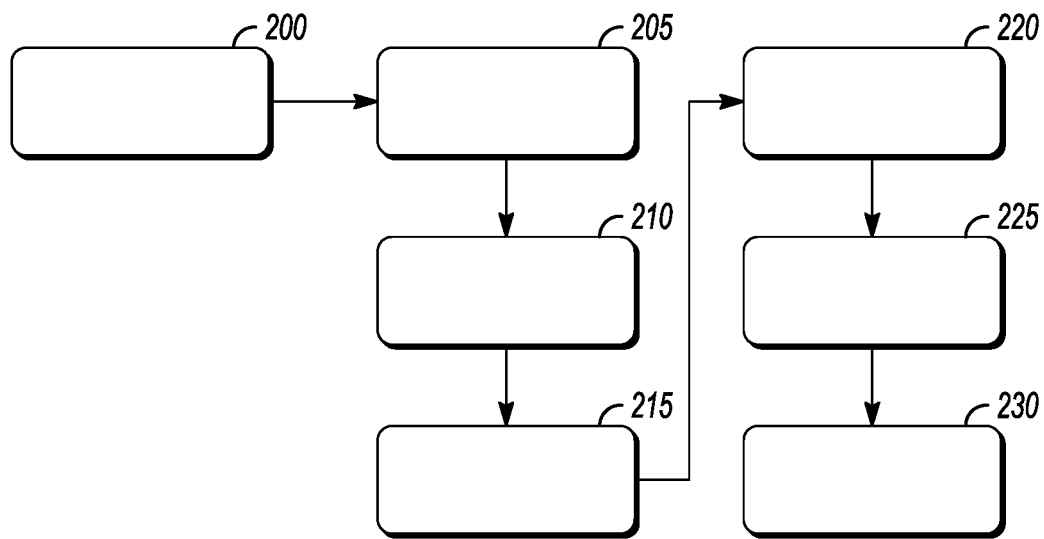
FIG. 13 is a flowchart showing an example method for manufacturing an example circuit card assembly.

An example method is shown in FIG. 13 for manufacturing a PCB that includes an SIW duplexer. At operation 200, the PCB is manufactured larger than necessary to compensate for the addition of the break-off or enlarged section. At operation 205, the PCB is scored to delineate the main PCB section from the break-off section. At operation 210, countersunk holes are drilled into the break-off section and at operation 215 the PCB assembly is positioned over and fixed to the stiffener using, for example, flat head screws. At operation 220, the PCB is populated with components in the CCA manufacturing stage, for example using an SMT process. Operation 220 includes solder paste being placed on the PCB, and components mounted by a pick-and-place machine. At operation 225, the soldered board is passed through a reflow soldering oven, and subsequently removed at operation 230. At operation 230, the break-off section is removed either manually or using a scoring wheel to depanelize the PCB from the break-offs.

The SIW duplexer and the rest of the RF front-end may be fabricated separately on different layers of a PCB. The RF front-end analog and digital circuits may be fabricated on the top layer while the SIW duplexers may be fabricated on the bottom layer. One of the reasons of separating the duplexers from the rest of the circuit may be to reduce the total form factor of the resulting device and to improve electrical isolation. However, keeping the SIW duplexer in a different layer includes guiding the RF signals from the top layer to the bottom layer without any loss of signal integrity or with an acceptable loss of signal integrity.

Figure 14:
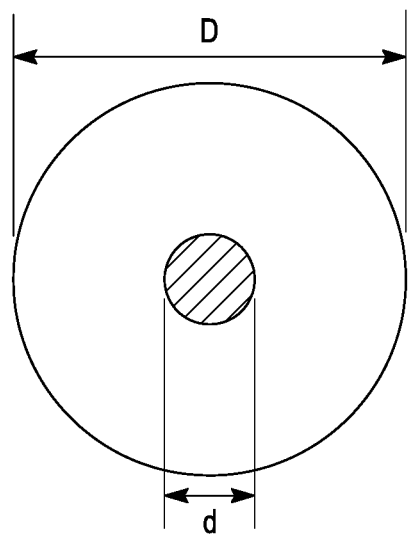
FIG. 14 shows an example via and formula to calculate its impedance.

A coaxial type of transition from the top layer (output of the PA) to the bottom layer (SIW filter input) may be used. The coaxial transition includes a center via hole, surrounded by grounded vias. The center via hole is equivalent to an inner conductor of a coaxial line and the outer vias are equivalent to the outer conductors. In some implementations, the radius of the inner via and the locations of the outer vias are calculated such that the overall impedance is 50 Ohm. One way to calculate the impedance and a representative via is shown in FIG. 14, which shows the center hole d and the larger grounded via D. The equation calculates the characteristic impedance (Zo) of a coaxial line for a TE11 mode as ZO in the equation of FIG. 14, where D and d are as mentioned above. As presented in the equation, Zo is dependent on the outer and inner conductor diameter and the material filling the space between the two conductors. Changing the diameters of the conductors and the material filling, the characteristic impedance of the coaxial line can be changed.

Figure 15:
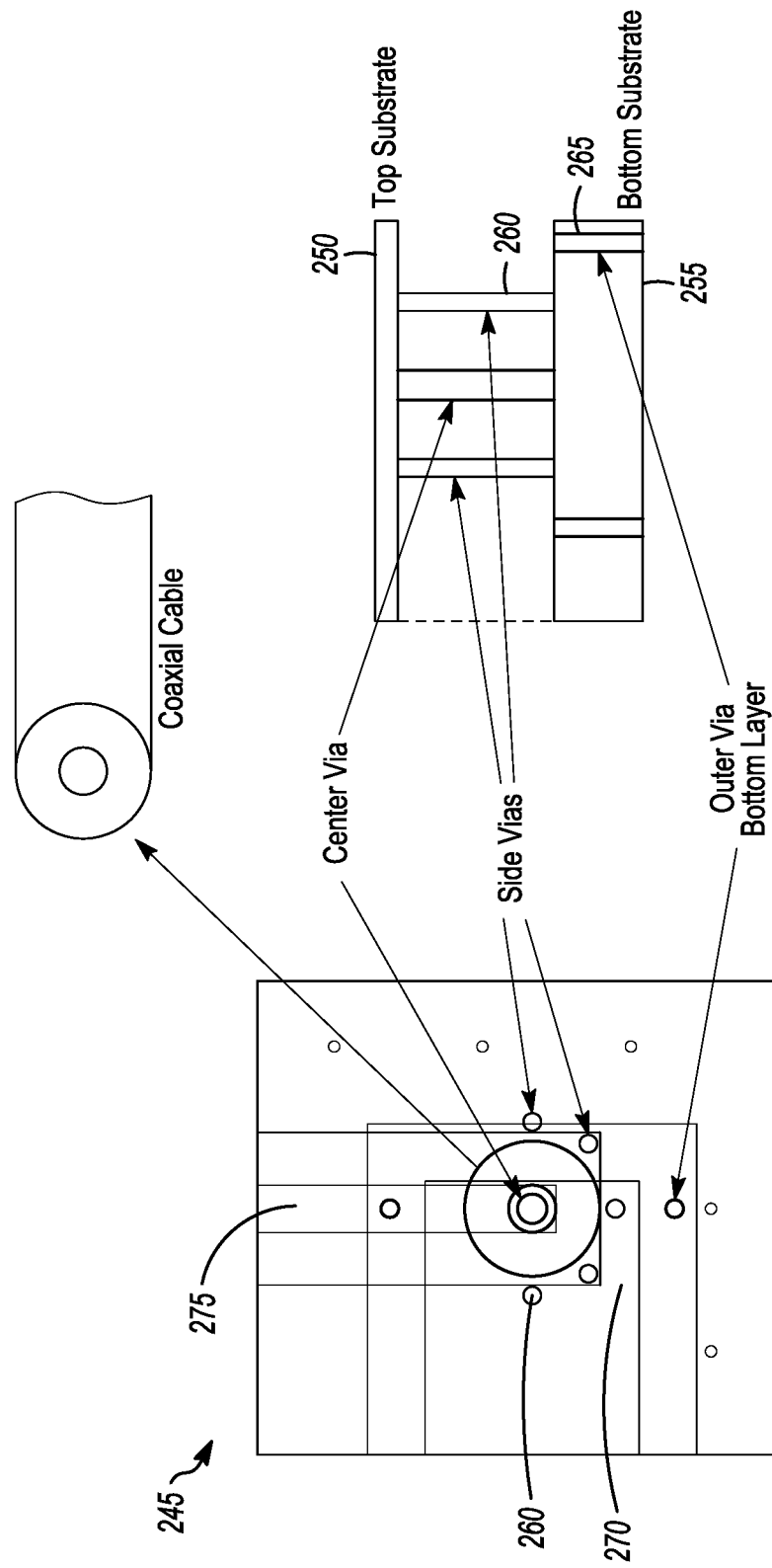
FIG. 15 illustrates an example via arrangement in an SIW-implemented duplexer used in the example front-end module.

FIG. 15 shows an example via hole arrangement 245 that may be used in an SIW duplexer included within the example front-end module. Since the top substrate layer 250 and bottom substrate layer 255 have different layer thicknesses in this example, the top layer coplanar line width and the bottom layer microstrip width are different. The microstrip transmission 270 line width of the bottom layer 255 where the filter (not shown) resides may be typically almost 5 times wider than the width of the top layer microstrip 275 width. Outer side vias 260 (equivalent to an outer conductor) and a center via of the coaxial lines or cables, when fabricated as through vias, will intersect the bottom microstrip line. The example front-end module includes vias 260 as buried vias, from the top layer 250 to the beginning of, but not through, the bottom layer 255. Another set of buried outer vias 265 are then again, fabricated through the bottom layer 255, at an offset away from the bottom microstrip line 270. The technique of shifting the via position at the bottom layer may improve the overall return loss of the transition. In some implementations, incorporating via electrical shielding all the way from top layer to bottom layer may be used to maintain good RF signal integrity.

Computing systems—including microcontrollers—that may be used to implement, or to control, at least part of the systems described herein may include various forms of digital computers. Examples of digital computers include, but are not limited to, laptops, desktops, workstations, personal digital assistants, servers, blade servers, mainframes, smart televisions and other appropriate computers. Computing systems may be part of, included in, or used to implement all or part of the base stations described herein. Examples of mobile devices that may be used to connect to, or through, the base stations include, but are not limited to, tablet computing devices, personal digital assistants, cellular telephones, smartphones, digital cameras, digital glasses and other portable computing devices. The computing devices described herein, their connections and relationships, and their functions, are meant to be examples only, and are not meant to limit implementations of the technology.

All or part of the systems described herein and their various modifications (hereinafter referred to as "the systems"), devices to control the systems, or both can be implemented, at least in part, via a computer program product, e.g., a computer program tangibly embodied in one or more information carriers, e.g., in one or more tangible machine-readable storage media, for execution by, or to control the operation of, data processing apparatus, e.g., a programmable processor, a computer, or multiple computers A computer program can be written in any form of programming language, including compiled or interpreted languages, and can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with implementing the systems can be performed by one or more programmable processors executing one or more computer programs to perform the functions of the calibration process. All or part of the systems can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Non-transitory machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Each computing device may include a graphics system, including a display screen. A display screen, such as an LCD or a CRT (Cathode Ray Tube) display, to a user, images that are generated by the graphics system of the computing device. As is well known, display on a computer display (e.g., a monitor) physically transforms the computer display. For example, if the computer display is LCD-based, the orientation of liquid crystals can be changed by the application of biasing voltages in a physical transformation that is visually apparent to the user. As another example, if the computer display is a CRT, the state of a fluorescent screen can be changed by the impact of electrons in a physical transformation that is also visually apparent. Each display screen may be touch-sensitive, allowing a user to enter information onto the display screen via a virtual keyboard. On some computing devices, such as a desktop or smartphone, a physical QWERTY keyboard and scroll wheel may be provided for entering information onto the display screen. Each computing device, and computer programs executed thereon, may also be configured to accept voice commands, and to perform functions in response to such commands. For example, the example systems described herein may be initiated at a client, to the extent possible, via voice commands.

Elements of different implementations described herein may be combined to form other implementations not specifically set forth above. Elements may be left out of the systems, computer programs, user interfaces, etc. described herein without adversely affecting their operation or the operation of the system in general. Furthermore, various separate elements may be combined into one or more individual elements to perform the functions described herein.

The foregoing description of various implementations has been presented for purposes of illustration and description. The foregoing description is not intended to limit the claims to the implementations disclosed herein.

Other implementations not specifically described herein are also within the scope of the following claims.

What is claimed is:

1. A circuit card assembly for a cellular base station front-end comprising:
    at least one component printed circuit board (PCB) layer having front-end module hardware components; and
    at least one filter PCB layer including at least one substrate integrated waveguide (SIW) filter;
    wherein the at least one substrate integrated waveguide comprises a top metallized surface, a bottom metallized surface, and a plurality of discrete via holes disposed therebetween, and wherein the plurality of discrete via holes are arranged so as to form two rows of metallic walls; and wherein the front-end module hardware components comprise a digital interface, a radio frequency (RF) transceiver, an RF power amplifier, and digital control circuitry.

2. The circuit card assembly of claim 1, further comprising a plurality of intermediate PCB layers between the at least one component PCB layer and the at least one duplexer PCB layer.

3. The circuit card assembly of claim 2, wherein the at least one component PCB layer and the at least one duplexer PCB layer each comprises a break-off section extending beyond respective outer perimeters of the at least one component PCB and the at least one duplexer PCB.

4. The circuit card assembly of claim 3, further comprising a scored portion at an intersection of the break-off sections and the respective at least one component PCB layer and the at least one duplexer PCB layer; the scored portion facilitating separation of the break-off sections from the respective at least one component PCB layer and the at least one duplexer PCB layer.

5. The circuit card assembly of claim 1, wherein a frequency of operation of the SIW filter is tunable to support multiple frequency bands.

6. The circuit card assembly of claim 5, further comprising at least one ferrite slab on an SIW transmission line, the at least one ferrite slab being configured to interfere with electromagnetic field patterns of the SIW filter thereby rendering the SIW filter tunable.

7. A cellular base station comprising an antenna and a base station front-end implemented on the circuit card assembly of claim 1; wherein the base station is an LTE evolved node B base station or a portable small cell base station.

8. A method for manufacturing a circuit card assembly comprising:
    manufacturing a PCB including a plurality of PCB layers having a main section and an enlarged section a break-off section;
    populating at least one layer of the plurality of PCB layers with components; and
    breaking off the enlarged section break-off section.

9. The method of claim 8, further comprising scoring the PCB at an intersection of the main section and the enlarged section at any point prior to the populating.

10. The method of claim 9, further comprising fixing the PCB to a stiffener.

11. The method of claim 10, further comprising, prior to the fixing, drilling countersunk holes in the PCB;
    wherein the fixing comprises fixing the PCB to the stiffener via the countersunk holes such that a top surface of the PCB is flat.

12. The method of claim 8, wherein the plurality of PCB layers includes at least one component layer and a filter layer.

13. The method of claim 12, wherein the filter layer is a substrate integrated waveguide (SIW) layer.

14. The method of claim 12, further comprising providing a first set of via holes in the at least one component layer and a second set of via holes in the filter layer.

* * * * *